United States Patent [19]

Cheng

[11] Patent Number: 4,825,143
[45] Date of Patent: Apr. 25, 1989

[54] DIGITAL METER AUTOMATIC OFF POWER SUPPLY CIRCUIT

[76] Inventor: Leo Cheng, 12F-7, No. 391, Sec. 4 Shin-Yi Rd., Taipei, Taiwan

[21] Appl. No.: 84,158

[22] Filed: Aug. 12, 1987

[51] Int. Cl.$^4$ .............................................. G05F 1/33
[52] U.S. Cl. .................................. 323/351; 307/140; 307/141; 364/707
[58] Field of Search ................. 323/349, 351; 307/140, 307/141; 364/200, 706, 707

[56] References Cited

U.S. PATENT DOCUMENTS 4,544,923 10/1985 Blatter et al. ........................ 307/140
4,733,100 3/1988 Nusairat et al. ..................... 307/141

Primary Examiner—Patrick R. Salce
Assistant Examiner—Anita M. Ault
Attorney, Agent, or Firm—Cushman, Darby & Cushman

[57] ABSTRACT

A digital display instrument with an automatic power-off device built-in which comprises a control circuit, a timing circuit and a display detection circuit. The power of the instrument is controlled by a push-button switch so that when the push-button switch is pressed down and released immediately, the power is turned on. If the push-button switch is pressed down and held for about 1.5 seconds, however, the power is turned off. The power can be turned off automatically by detecting if the instrument has not been used for a pre-set period of time. After the power is turned on, the display detection circuit will monitor the reading on the display continuously to determine whether the instrument is in use or not. If the detection shows the instrument is still in use, the timer will be reset to maintain the power on for another period of time. However, if a condition of not being in use is detected within the preset period of time, the power will be turned off automatically.

2 Claims, 3 Drawing Sheets

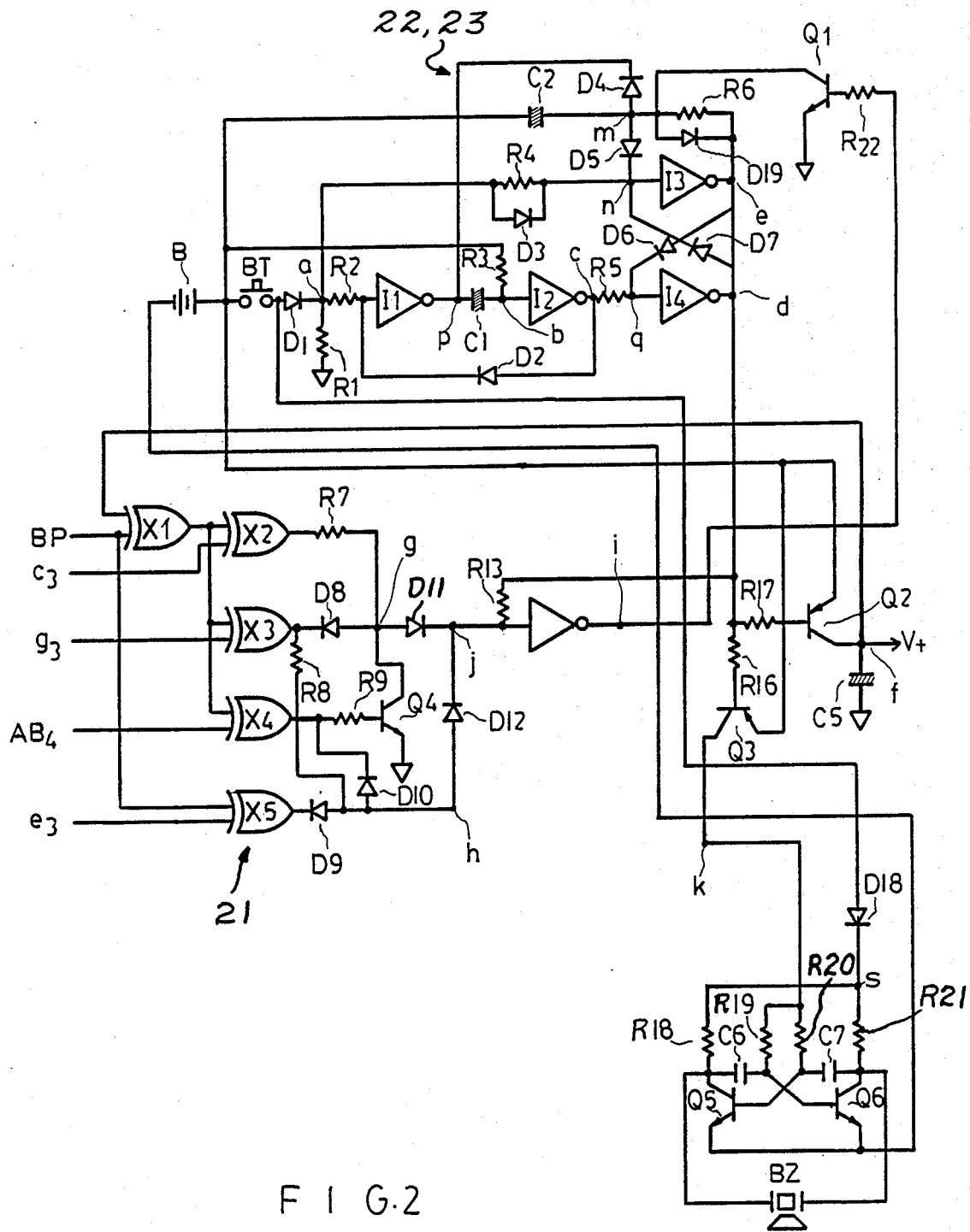
F I G. 2

DIGITAL METER AUTOMATIC OFF POWER SUPPLY CIRCUIT

BACKGROUND OF THE INVENTION

The present invention relates to an automatic switch circuit which continuously monitors the numerals being displayed by a digital meter so that the device is turned "OFF" after a predetermined interval of detecting that the numerals are not displaying a reading.

Prior art digital instruments seldom contain a built-in automatic power off function. Thus, when the user forgets to turn off the power after use, the current of the battery will be consumed continuously so as to shorten the battery life. As a remedy to the foregoing problem, the present inventor has developed a power supply system which can be switched off automatically within a specific period of time. However, it is not ideal for the power supply system to be switched off after a specific period of time, since switching the instrument off would cause inconvenience to the user if the instrument has to be continuously used.

SUMMARY OF THE INVENTION

Therefore, the present invention is directed to a device for detecting the numerical reading of a 7 segment digital display to determine whether the instrument is in use or not. If the detection shows that the instrument is still being used, the timing circuit of the power supply will be reset to maintain the power supply "ON" for another period of time. If the instrument is not detected to be in use within a predetermined period of time, the power supply will automatically be switched off when the period of time is over. Then the turning off function becomes more perfect and is more convenient to a user.

Accordingly, the present invention provides an automatic-off power supply device for a digital instrument. The device has a push-button switch to control the on-off state of the power supply. The power can be obtained when the push-button switch is pressed down and released immediately. On the other hand, the power will be turned off if the push-button switch is pressed down and held for about 1.5 seconds. At the same time, however, the numerals being displayed on the display will be continuously monitored by the detecting circuit after the power is turned on. When the numerals being displayed meet the condition of being in use, the timing circuit will be reset and recount from the beginning so as to enable the power to be turned "ON" for another period of time. If the numerals being displayed to not meet the condition of being in use, however, the power will be turned off automatically once the specific period of time is over.

BRIEF DESCRIPTION OF THE DRAWINGS

FIG. 2 is the circuit diagram of the power of the power supply device of the embodiment of FIG. 1.

DETAILED DESCRIPTION OF THE PREFERRED EMBODIMENT

Figure 1:
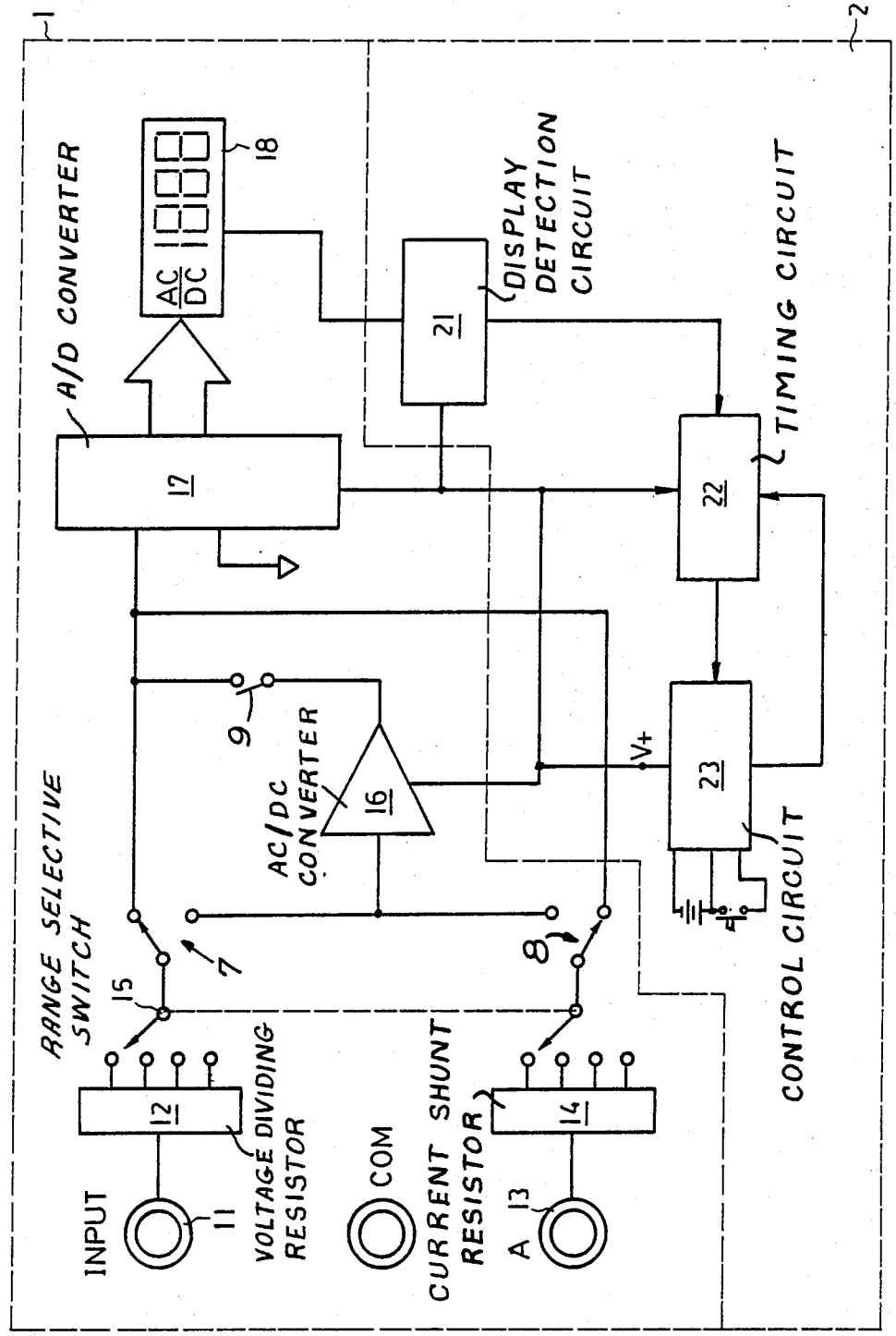
FIG. 1 is a block diagram of a digital multimeter with a built-in automatic off power system according to the embodiment of the present invention.

The operation of this invention is described in detail as follows:

FIG. 1 illustrates the application of the present invention in a digital multimeter which comprises: (1) the digital multimeter and (2) the automatic off power supply circuit. The digital multimeter (1) comprises a voltage input terminal (11), a voltage dividing resistor (12), a current input terminal (13), a current shunt resistor (14), a ganged range selective switch (15), switches (7), (8), and (9), an AC/DC converter (16), an A/D converter (17), and a 7 segment display (18), whereas the automatic-off switch circuit for the power supply device (2) comprises a display detection circuit (21), a timing circuit (22), and a control circuit (23).

(1) To switch on the power supply:

FIG. 2 is a schematic diagram of the power supply device of this invention, wherein (B) is the battery, which upon the push-button switch (BT) being pushed down gives the point "a" a high potential via diode D1. Point "a" is grounded across resistor R1 and its current is input into the inverter I1 across resistor R2 to cause a low potential at point "p". This low potential is coupled through capcitor C1 to cause a low potential at point b, and is then coupled through the inverter I2 to cause a high potential at the point "c". Thus, at this moment, point "a" is high, and point "n" is also high from the voltage applied from point "a" across the parallel combination of resistor R4 and diode D3. Through the inverter I3, point "e" is also low. Also, point "q", which is connected to point "c" across resistor R5, is at a high potential, which results in a low potential at point "d" after inversion by inverter I4. Since point "d" is "low", the transistor Q2 is triggered into the "on" state across resistor R17. In that case, the power is output through Q2 to point "f", which is connected to ground across capacitor C5. At this moment, if the push-button switch (BT) has been released, point "a" will become "low", while point "n" through R4 and D3 is also "low", and point "e" will become "high". Since point "e" becomes "high", point "q" also becomes "high" across diode D6 so that point "d" remains "low". Q2 is thus kept in the "on" state so as to maintain the power supply on.

Figure 3:
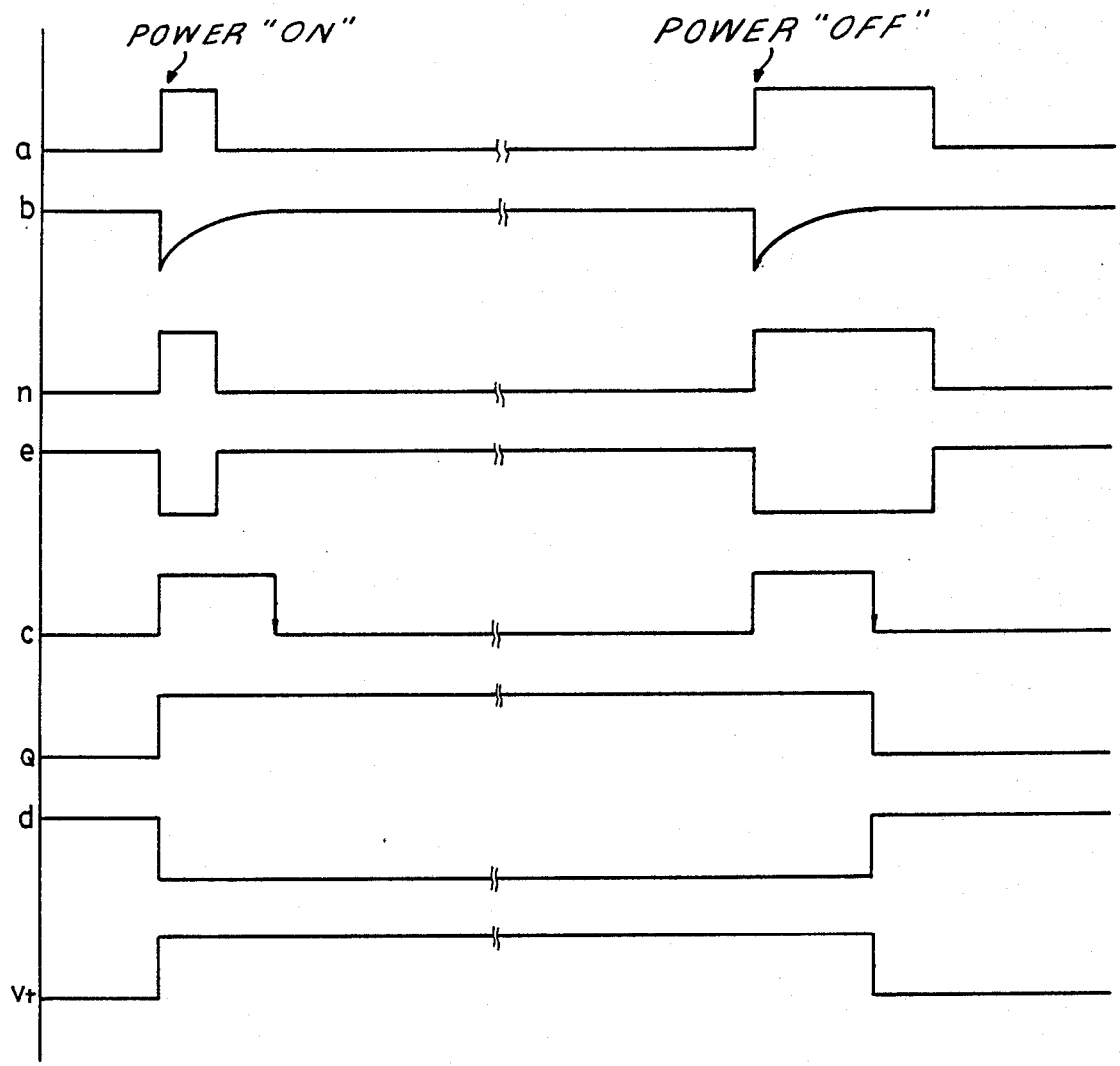
FIG. 3 illustrates the waveforms at various points in FIG. 2.

Therefore, as shown in the first half of FIG. 3, when the push-button switch (BT) is being pressed and released immediately, the power supply is turned on. Meanwhile, since point "d" is "low", point "n" is made "low" across diode D7, and transistor Q3 is also triggered into the "on" state across resistor R16 to cause a high potential at point "k". Thus, when the push-button switch (BT) is pushed down, both point "k" and point "S" (via diode D18) are at high potential. The oscillation circuit, which consists of resistors R18, R19, R20, R21, capacitors C6 and C7, and transistors Q5 and Q6, oscillates to drive the buzzer (BZ) when point "k" and "s" are at high potential. Thus, by hearing of the sound output from buzzer (BZ), it is possible to judge whether the push-button switch (BT) has been pressed down firmly to turn on or turn off the power.

(2) To switch off the power supply:

A. Manual switching off:

After the power supply is turned on, if the user wants to switch it off before the automatic switch off is applied, he can do so manually by pressing down the push-button switch (BT) and holding it for about 1.5 seconds, for when the push-button switch (BT) is pressed, the battery will charge capacitor C1 through resistor R3. After about 1.5 seconds C1 will be fully charged to cause point "b" to become "high" as shown in the latter half of FIG. 3, although it was previously "low". Therefore, both point "c" and point "q" are "low" (because at that time point "e" is "low"), which in turn causes point "d" to have a high potential as shown in FIG. 3. As a result, transistor Q2 is charged into a non-conductive state and the power supply is cut off.

B. Automatic switching off:

When the push-button switch (BT) is pressed, both point "e" and point "p" are low so as to casue capacitor C2 to be fully charged through diodes D19 and D4. After the power is turned on, point "e" and point "p" are turned "high". Capacitor C2 is thus discharged through R6 by the high potential of point "e". The potential level of point "m" will be increased so as to become "high" when capacitor C2 is fully discharged. The high of point "m" causes point "n" to become "high" across diode D5, and point "e" and point "q" thus become "low". Through the inverter I4, the "low" potential level at point "q" becomes "high" at point "d". Therefore, transistor Q2 becomes nonconductive, and the power output is cut off. The values of resistor R6 and capacitor C2 can affect the speed of discharge, so the period for turning off the power automatically can be pre-set by choosing the proper values for R6 and C2.

(3) To sense the status of "In-use":

If the power supply can only be turned off when the preset time is over, it would be inefficient. Also, the user sometimes may want to use the instrument for a longer time than the preset time.

Since the automatic turning "off" of the power supply will cause some inconvenience to the user if the device is still in use, this invention detects the numerals being shown on the digital display to judge whether the instrument is being used. If the instrument is being used, the timing circuit in the instrument will be reset and counting of the preset time interval will start over from the beginning so as to power the instrument as long as it is being used.

A 3½ digit multimeter 7-segment display 18 of the type shown in FIG. 1 may be used as an example to illustrate how to define and detect the status of "In-use". As is known in the art, each segment of the 3½ digit 7-segment display is assigned a value for different numerals. Different segments are powered for denoting each respective numeral reading from 0 to 9, for example. In the general digital multimeter, a reading of 000 indicates no input for the measurement of voltage and current, while 1000 (Note 0 means no indication) indicates no input for the resistance measurement. However, in the AC 200 mV range (where resolution is 0.1 mV), even without performing a measurement the external noise signal may cause a small reading value on the display because of high input impedance (Normally ≧ 10 Mohm) of the digital multimeter, particularly when the test probes are inserted in the input terminals and held by hands without doing measurement, for the body of the user will act like an antenna to pick up more noise, thereby causing a higher reading value on the display (Normally ≦ 100 counts). Therefore, in order to allow the automatic power off to function properly in the AC 200 mV range without being affected by external noise, it is assumed that the multimeter is not "in-use" if the reading on the display is 1000 (Note 0 means no indication) or ≦ 100 (i.e. from 0-99, which is less than 5% of the full scale 1999. Under normal operation, the reading usually is greater than 99, but if the reading is smaller, the lower range may be selected to get a higher resolution reading). Of course, for other applications, the instrument can be defined to be not "in-use" if the reading is smaller than 10 counts or 3 counts, for example.

From the foregoing definition of "in-use" for the multimeter, it is apparent that if the multimeter is not "in-use" at the range of voltage and the current being measured that the most significant digit AB4 will indicate nothing, while Digit 3, the second most significant digit, will indicate 0. However, during operation the resistance measurement will cause AB4 to indicate 1, while Digit 3 indicates nothing. The aforesaid state is expressed with an equation as follows;

Not in use = AB4 does not indicate anything and Digit 3 indicates 0 or anything, AB4 indicates a 1 and Digit 3 does not indicate. Therefore, we get the following equation:

$$\text{not in use} = \overline{AB4}(e3 \cdot \overline{g3}) + AB4(\overline{C3} \cdot \overline{g3}) \quad \text{Equation (A)}$$

$$\begin{aligned}
\text{in use} &= \overline{\text{not in use}} = \overline{\overline{AB4}(e \cdot \overline{g3}) + AB4(\overline{C3} \cdot \overline{g3})} \\
&= \overline{\overline{AB4}(e3 \cdot \overline{g3})} \cdot \overline{AB4(\overline{C3} \cdot \overline{g3})} \\
&= [AB4 + \overline{(e3 \cdot \overline{g3})}] \cdot (\overline{AB4} + C3 \cdot g3) \\
&= [AB4 + \overline{e3} + g3] \cdot [\overline{AB4} + C3 + g3]
\end{aligned}$$

where C3 and e3 are segments of Digit 3 which are lit for a "0" and g3 is a segment of Digit 3 not lit for "0", and where "·" means "and" and "+" means "or".

In FIG. 2, exclusive OR gates X1, X2, X3, X4, X5, transistor Q4, diodes D8, D9, D10, D11, D12, and resistors R7, R8, R9 and R13 constitute a detection circuit for implementing this equation which causes the signal at the point "g" to be AB4·C3·g3, at the point "h" to be AB4·g3·e3, at the point "j" to be AB4·$\overline{C3}$·$\overline{g3}$+e,ovs-/AB4/·C3·$\overline{g3}$, and at the end point "i" to be $\overline{AB4}$(e3·g3-)+AB4(C3·g3). Equation (A) thus represents whether the multimeter is in "in-use" status. In other words, when the multimeter is "in-use" the potential of the point "i" is high, and this will turn transistor Q1 into the "on" status via resistor R22, whereby capacitor C2 will be charged to achieve a reset of the timer. Therefore, the timing device will recount the time from the beginning whenever the multimeter is being used. Therefore, the instrument will remain "on" as long as it is being used.

I claim:

1. A digital instrument automatic off power supply circuit for automatically stopping power supply to a digital instrument having a segmented digital display, comprising:

display detection means for continuously monitoring the display status of respective segments of said digital display of said digital instrument when power is being supplied to said digital instrument so as to determine if the digital instrument is being used;

timing means for counting to a predetermined count corresponding to an automatic off interval; and control means for controlling power supply to said digital instrument, wherein power supply is maintained to said digital instrument and the count of said timing means is reset when said display detection means detects that said digital instrument is being used, and power supply to said digital instrument is automatically stopped when said predetermined count has been reached, thereby indicating that said digital instrument has not been used for said automatic off interval.

2. A digital instrument automatic off power supply circuit as in claim 1, further comprising a push-button power switch, said push-button power switch starting power supply when pressed down and immediately released and manually stopping power supply when pressed down and held for a predetermined manual off time interval.

* * * * *